US008576943B2

(12) United States Patent
Kilambi et al.

(10) Patent No.: US 8,576,943 B2
(45) Date of Patent: Nov. 5, 2013

(54) LINEARIZATION FOR A SINGLE POWER AMPLIFIER IN A MULTI-BAND TRANSMITTER

(75) Inventors: Sai Mohan Kilambi, Ottawa (CA); Bradley John Morris, Ottawa (CA)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 285 days.

(21) Appl. No.: 13/228,926

(22) Filed: Sep. 9, 2011

(65) Prior Publication Data

US 2013/0064325 A1 Mar. 14, 2013

(51) Int. Cl.
H04L 25/49 (2006.01)
H03K 7/00 (2006.01)
H03C 3/04 (2006.01)
H03C 1/04 (2006.01)
H04B 1/10 (2006.01)

(52) U.S. Cl.
USPC ........... 375/296; 332/107; 332/123; 332/159; 455/114.3

(58) Field of Classification Search
USPC ............ 375/285, 295, 296, 297, 377; 455/91, 455/114.2, 114.3; 332/106, 107, 117, 123, 332/149, 159; 398/193
See application file for complete search history.

(56) References Cited

U.S. PATENT DOCUMENTS

| 6,853,244 | B2 | 2/2005 | Robinson et al. |
| 6,999,532 | B2 | 2/2006 | Kuo et al. |
| 8,295,789 | B2 * | 10/2012 | Suzuki et al. .............. 455/114.3 |
| 2001/0054974 | A1 | 12/2001 | Wright |
| 2002/0048326 | A1 * | 4/2002 | Sahlman ....................... 375/297 |
| 2008/0095266 | A1 * | 4/2008 | Rashev et al. ................ 375/298 |

FOREIGN PATENT DOCUMENTS

| EP | 1732208 B1 | 3/2005 |
| EP | 1732207 A1 | 12/2006 |
| WO | WO0039920 A1 | 7/2000 |

OTHER PUBLICATIONS

Choi, Sungho, et al, Design of Digital Predistorters for Wideband power Amplifiers in Communication Systems with Dynamic Spectrum Allocation, pp. 3204-3207, 2011 IEEE, Hanbat National University, Republic of Korea.

* cited by examiner

Primary Examiner — Tesfaldet Bocure
(74) Attorney, Agent, or Firm — David J. Rahmer; Ericsson Canada Inc.

(57) ABSTRACT

A multi-band signal is generated by combining two or more input signals separated in frequency. The input signals are combined either before or after predistortion depending on the bandwidth of the multi-band signal. If the bandwidth of the multi-band signal is less than a predetermined bandwidth threshold, the input signals are combined and predistortion is applied to the combined signal to generate the multi-band signal. If the bandwidth of the multi-band signal is greater than the bandwidth threshold, the individual input signals are predistorted and subsequently combined to generate the multi-band signal.

32 Claims, 13 Drawing Sheets

FIGURE 2: SIGNALS M, N ARE SENT ON ONE TX CHAIN AND Q IS SENT ON A DIFFERENT TX CHAIN

LINEARIZATION FOR A SINGLE POWER AMPLIFIER IN A MULTI-BAND TRANSMITTER

TECHNICAL FIELD

The present invention relates generally to power amplifiers for wireless transmitters in mobile communication networks and, more particularly to predistortion of the input signals to a multi-band power amplifier to compensate for non-linearity of the power amplifier.

BACKGROUND

One current trend in radio architecture for wireless transmitters in high data rate networks is using a dual-band power amplifier to simultaneously transmit data on two different frequency bands. It is well known that power amplifiers are non-linear devices. These non-linearities can manifest as intermodulation products that fall inside as well as outside the signal bandwidth. Depending on the severity of the non-linearity, the distortion can result in spectral components that violate spectral masks established by the Federal Communication Commission (FCC) and other regulatory bodies.

Generally, intermodulation products that fall on frequencies very far away from the signal's center frequency maybe removed by filtering. However, intermodulation products caused by third order non-linearities (IM3) of the power amplifier generally manifest as spectral components close to the center frequency of the signal. These spectral components cannot be easily removed by filtering. Therefore, alternate techniques are needed to remove or reduce these spectral components.

Digital predistortion is one technique used to compensate for the non-linearities of the power amplifier. The general principle behind digital predistortion is to distort the input signal in such a way that the overall system of the predistorter and the power amplifier is linear. In essence, the predistorter models the inverse non-linear characteristic of the power amplifier. As a general rule of thumb, the digital predistorter must support bandwidths that are three to five times the instantaneous signal bandwidth. The high sample rates required make digital predistortion impractical for dual-band signals. For instance, if the goal is to transmit a 20 MHz complex signal, the digital predistorter should run at a sampling rate greater than 100M samples/sec in order to effectively linearize the power amplifier. In the case of dual-band transmission where the signal bands are widely separated in frequency, very high sample rates are required because the total bandwidth of the combined signal is large.

As an example consider an LTE TDD implementation where one needs to transmit a 20 MHz signal (signal A) via band 35 (1850-1910 MHz) and simultaneously transmit another 20 MHz signal (signal B) via band 36 (1932-1990 MHz). Additionally, suppose signal A is centered on 1860 MHz and signal B is centered on 1980 MHz resulting in a total signal bandwidth of 140 MHz (=1990-1850 MHz). Using the rule of thumb, the predistorter will have to support a bandwidth in excess of 700 MHz (=5×140 MHz) for good linearization performance. Such a predistorter may be difficult to implement in current silicon technologies given the complexity of the design.

Another problem associated with multi-band transmission is that of insufficient linearization performance when the input signals are tuned to frequencies that are relatively nearby and when predistortion is being employed for linearization. In order to successfully linearize a power amplifier, the predistorter must be able to resolve and reduce or eliminate the effects of the non-linearity caused by the power amplifier. However, in the case of multi-band transmission, the signal energies may overlap after predistortion which would be impossible to resolve individually in the feedback path.

SUMMARY

The present invention provides a method and apparatus for linearizing the output of a power amplifier in a dual-band or multi-band transmitter. A multi-band signal is generated by combining two or more input signals separated in frequency. The input signals are combined either before or after predistortion depending on the separation in the frequency domain of the input signals. When two or more input signals are closely spaced so that their bandwidths overlap, the input signals are combined and predistortion is applied to the combined signal to generate the multi-band signal. When one of the multi-band signals is separated by a sufficient distance from the other input signals so that its bandwidth does not overlap with other input signals, the input signal is predistorted individually and combined with one or more other input signals following predistortion to generate the multi-band signal. The predistortion can be performed in analog or digital domains. A single power amplifier amplifies the multi-band signal to generate an output signal. The output signal from the power amplifier is fed back to the adaptation circuit, which adapts the predistorter based on the feedback.

Exemplary embodiments of the invention comprise methods for transmitting a multi-band output signal. In one exemplary method, the bandwidth of a composite signal comprising two or more input signals to be transmitted on different frequency bands is determined. The bandwidth of the composite signal is compared to a bandwidth threshold. If the bandwidth of the composite signal is less than the bandwidth threshold, the multi-band signal is generated by predistorting the composite signal. If the bandwidth of the composite signal is greater than the bandwidth threshold, the multi-band signal is generated by predistorting at least one of the individual input signals before combining with other input signals. The multi-band signal is then amplified by a power amplifier to generate an output signal.

Other embodiments of the invention comprise a multi-band transmitter for transmitting a multi-band signal comprising two or more input signals separated in frequency. In one exemplary embodiment, the transmitter comprises a transmit circuit and a selection circuit. The transmit circuit comprises a plurality of predistorters, one or more combiners to selectively combine two or more input signals before predistortion depending on a bandwidth of a composite signal including the two or more input signals, and an amplifier to amplify the multi-band signal to generate a multi-band output signal. The selection circuit configures the transmit circuit depending on the bandwidth of the composite signal. When the bandwidth of the composite signal is greater than a predetermined bandwidth threshold; the selection circuit configures the transmit circuit to generate a multi-band signal by predistorting at least one of the input signals individually in a component predistorter. When the bandwidth of the composite is less than a predetermined bandwidth threshold, the selection circuit configures the transmit circuit to generate a multi-band signal by predistorting the composite signal.

The present invention improves linearization performance when the input signals are tuned to frequencies that are relatively nearby by combining the input signals and predistorting the composite signal. The present invention also avoids high sampling rates when the input signals are far apart by separately predistorting the input signals before combining. Other advantages of the invention will be apparent to those skilled in the art from the following description and drawings.

DETAILED DESCRIPTION

Figure 1:
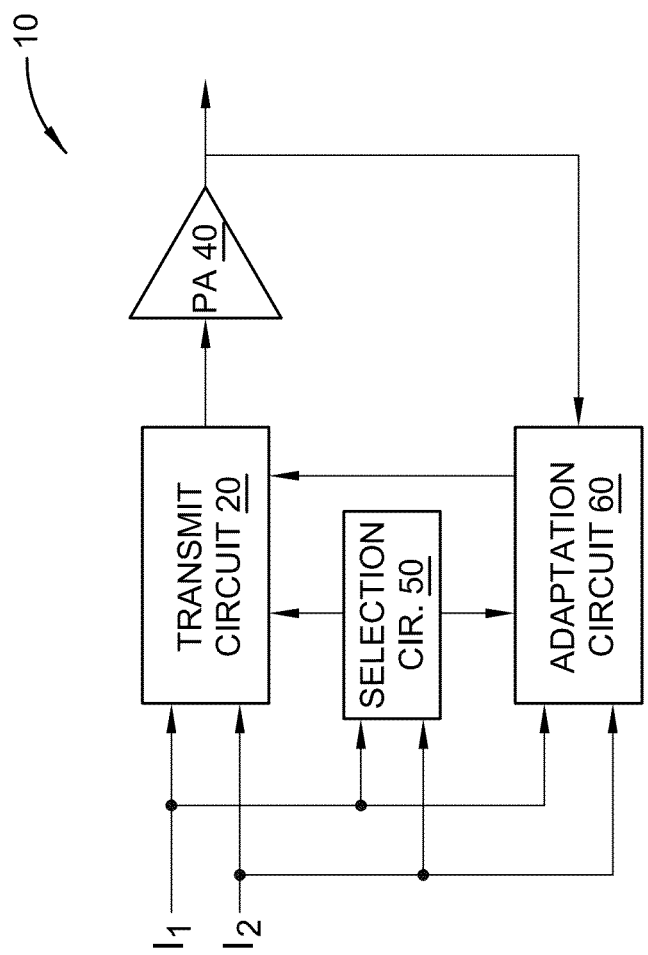
FIG. 1 illustrates an exemplary multi-band transmitter according to one exemplary embodiment.

Referring now to the drawings, embodiments of a multi-band transmitter 10 for linearizing the output of a power amplifier are shown. The multi-band transmitter 10 may include up to three modes of operation, referred to herein as the high bandwidth mode, the low bandwidth mode, and the mixed bandwidth mode. In the high bandwidth mode, the multi-band transmitter 10 predistorts the individual input signal separately before combining. In the low bandwidth mode, the multi-band transmitter 10 combines all of the individual input signals before predistortion. In the mixed bandwidth mode, the multi-band transmitter 10 combine two or more input signals with overlapping bandwidths before predistortion, while input signals that do not overlap are predistorted separately.

FIG. 1 illustrates one exemplary architecture for a multi-band transmitter 10 with two operating modes: a high bandwidth mode and a low bandwidth mode. The multi-band transmitter 10 may be used in a base station or other wireless terminal in a mobile communication network. The multi-band transmitter 10 comprises a transmit circuit 20, power amplifier 40, selection circuit 50, and adaptation circuit 60. Two or more input signals are input to the transmit circuit 20. In the exemplary embodiment, two transmit signals are shown and denoted as $I_1$ and $I_2$. Those skilled in the art will appreciate that the present invention is not limited to two input signals. As will be hereinafter described in greater detail, the input signals are shifted to desired frequency bands and the transmit circuit 20 is configured to combine the input signals either before or after predistortion depending on the bandwidth. If the bandwidth of the multi-band signal is less than a predetermined bandwidth threshold, the transmit circuit 20 is configured to operate in a low bandwidth mode. In the low bandwidth mode, the transmit circuit 20 combines the input signals and predistortion is applied to the combined signal to generate the multi-band signal. If the bandwidth of the multi-band signal is greater than the bandwidth threshold, the transmit circuit 20 is configured to operate in a high bandwidth mode. In the high bandwidth mode, the transmit circuit 20 predistorts the individual input signals before combining to generate the multi-band signal. The predistortion can be performed in analog or digital domains. The power amplifier 40 amplifies the multi-band signal output by the transmit circuit 20 to generate an output signal. The output signal from the power amplifier 40 is fed back to the adaptation circuit 60, which adapts the predistorter based on the feedback. The selection circuit 50 configures the transmit circuit 20 and adaptation circuit 60 for the selected operating mode.

The bandwidth threshold is selected based on the bandwidths of the individual input signals after predistortion (i.e., after accounting for the 3-5× increase in bandwidth for each input signal) and the bandwidth of separation between them. In the case of a digital implementation, the sampling rate Fs of the predistorters needs to be higher than that of the bandwidth threshold. This requirement imposes an upper limit on the value of the bandwidth threshold.

Figure 2:
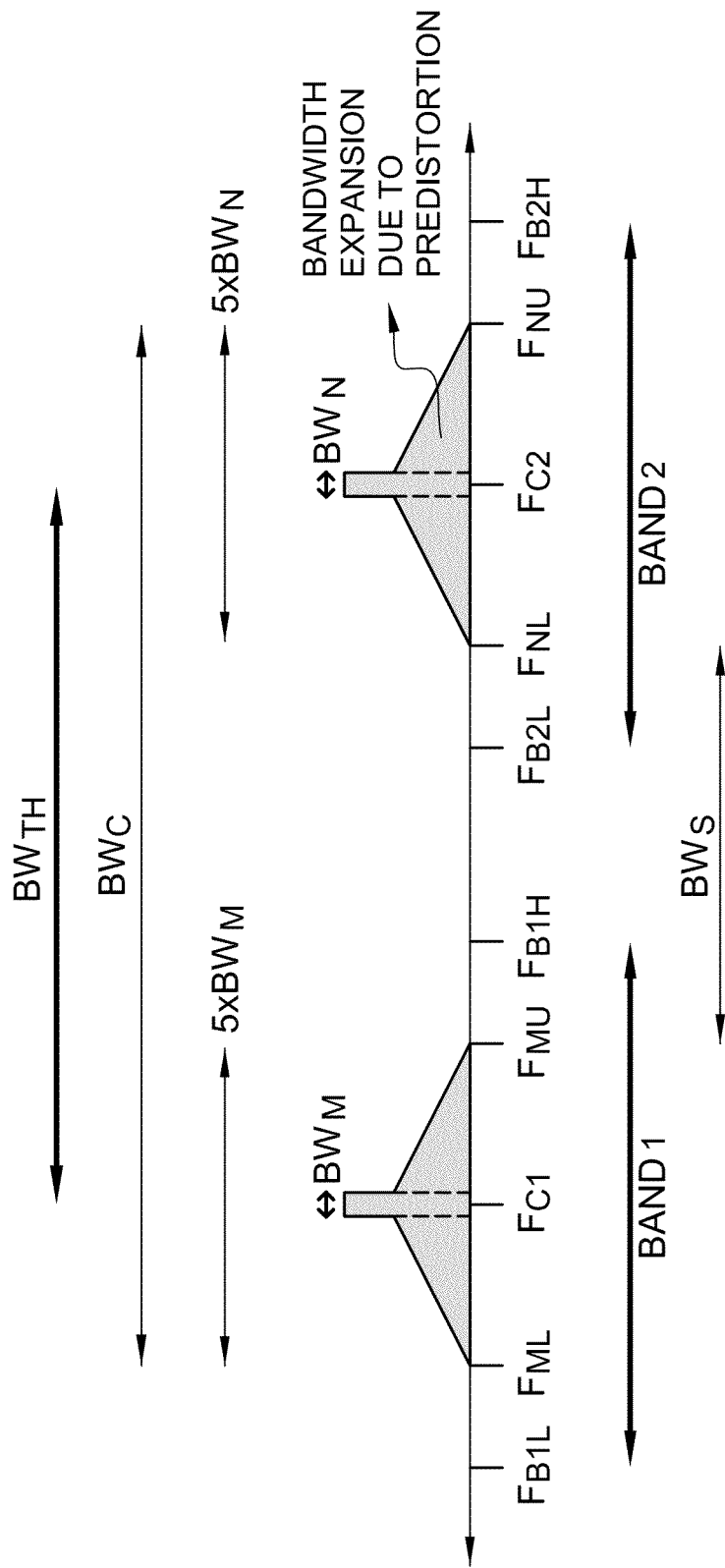
FIG. 2 illustrates a multi-band signal having a bandwidth greater than the bandwidth threshold in the case of two input signals.
Figure 3:
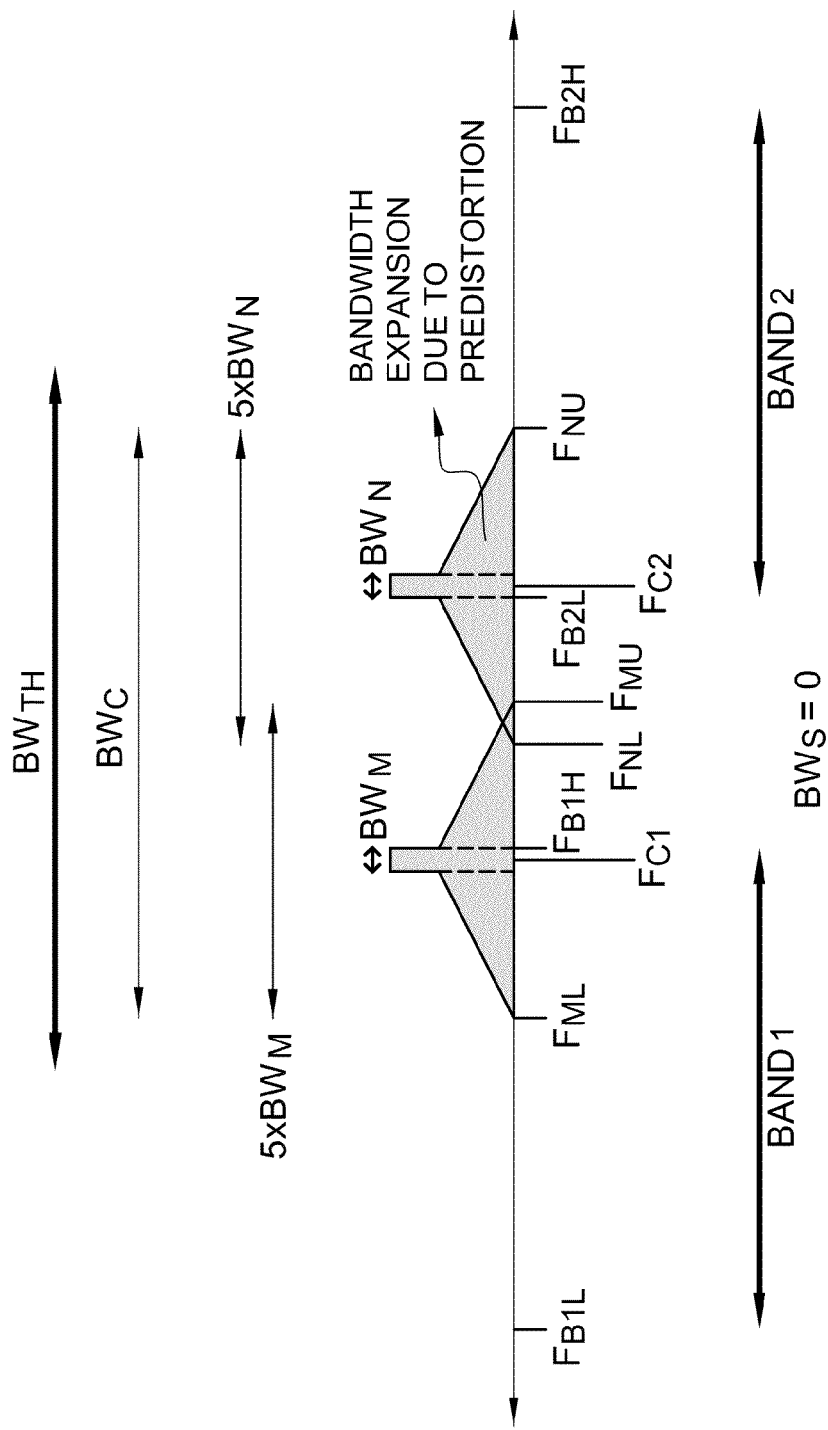
FIG. 3 illustrates a multi-band signal having a bandwidth less than the bandwidth threshold in the case of two input signals.

FIGS. 2 and 3 illustrate a multi-band signal with corresponding bandwidth annotations. FIGS. 2 and 3 show a signal M with bandwidth $BW_M$ centered on radio frequency (RF) $F_{C1}$ in band 1 and a signal N with bandwidth $BW_N$ centered on RF $F_{C2}$ in band 2. Band 1 ranges from frequency $F_{B1L}$ to $F_{B1H}$ and band 2 ranges from $F_{B2L}$ to $F_{B2H}$. Thus, $$F_{B1L} < F_{C1} < F_{B1H} \text{ and} \qquad \text{Eq. (1)}$$

$$F_{B2L} < F_{C2} < F_{B2H} \qquad \text{Eq. (2)}$$

The frequencies in band 1 are lower than those of band 2.

FIGS. 2 and 3 illustrate the edges of the input signals after taking bandwidth expansion due to predistortion into account. The edges of signal M are denoted as $F_{ML}$ and $F_{MU}$ for the lower and upper edges respectively. The edges of signal N are denoted as $F_{NL}$ and $F_{NU}$ for the lower and upper edges respectively. The bandwidth of the multi-band signal can then be computed according to:

$$BW_C = F_{NU} - F_{ML} \qquad (3)$$

The separation bandwidth $BW_S$ between band 1 and band 2 is:

$$\begin{aligned} BW_S &= F_{NL} - F_{MU}, & \text{for } F_{NL} > F_{MU} \\ BW_S &= 0, & \text{for } F_{NL} \leq F_{MU} \end{aligned} \Bigg\} \qquad \text{Eq. (4)}$$

For this example, it is assumed that the frequencies in band 1 are lower than those of band 2.

If $BW_C$ is greater than the bandwidth threshold $BW_{TH}$ as shown in FIG. 2, signals M and N are both tuned and predistorted separately and then combined to form the multi-band signal, which is subsequently modulated and then amplified by the power amplifier 40. Tuning can be performed before or after predistortion. If $BW_C$ is less than the bandwidth threshold $BW_{TH}$ as shown in FIG. 3, the signals M and N are tuned separately and then combined to create a composite signal. The composite signal is then predistorted to create a multiband signal. The multi-band signal is subsequently upconverted, modulated, and then amplified by the power amplifier 40.

The bandwidth threshold $BW_{TH}$ should be at a minimum greater than the maximum of the instantaneous bandwidths of signals M and N after taking predistortion into consideration. This requirement can be expressed as:

$$BW_{TH} > 2 \times k \times \max[BW_M, BW_N] \quad \text{Eq. (5)}$$

The factor k can range from 3 to 5 times the original signal bandwidth. The factor 2 represents the number of input signals, which in this example is 2. It will be understood by those skilled in the art that the above inequality can be easily generalized to a multi-band case as follows:

$$BW_{TH} > n \times k \times \max[BW_M, BW_N, \ldots] \quad \text{Eq. (6)}$$

where n is the number of input signals being transmitted.

In some embodiments of the invention, the separation bandwidth $BW_S$ of the input signals may be used instead of the overall bandwidth $BW_C$. The objective is to combine and predistort a composite signal when the input signals are closely spaced, and to predistort the input signal individually when they are spaced far apart. For this purpose, both the overall bandwidth $BW_C$ and the separation bandwidth $BW_S$ of input signals provide a suitable indication. In one exemplary embodiment, the input signals are combined and predistorted as a composite signal when the bandwidths of the input signals after predistortion will likely overlap.

Figure 4:
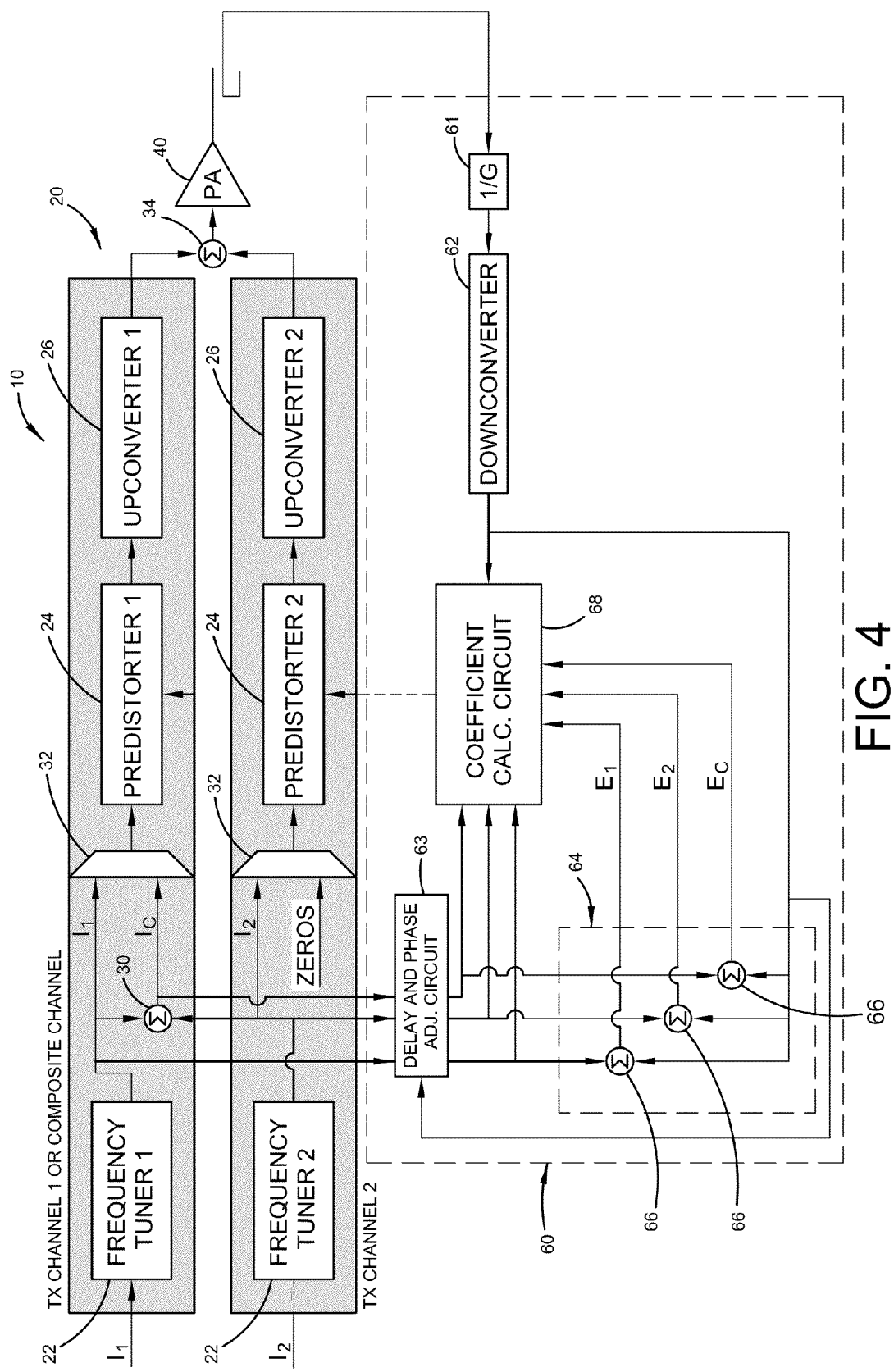
FIG. 4 illustrates a first embodiment of a multi-band transmitter where predistortion is performed in the analog domain.

FIG. 4 illustrates an exemplary embodiment of a dual-band transmitter 10 where frequency tuning, predistortion, and upconversion are performed in the analog domain. As previously described, the dual-band transmitter 10 includes a transmit circuit 20, power amplifier 40, selection circuit 50 (not shown in FIG. 4), and an adaptation circuit 60. The transmit circuit 20 includes two transmit channels denoted as TX Channel 1 and TX Channel 2. Those skilled in the art will appreciate that the transmitter could include three or more transmit channels. Each transmit channel includes a frequency tuner 22, predistorter 24, and upconverter 26. One of the transmit channels also includes a combiner 30. First and second analog input signals $I_1$ and $I_2$ are input to their respective transmit channels. The frequency tuners 22 shift the frequencies of respective ones of the input signals $I_1$ and $I_2$ to create a desired frequency offset or separation. The frequency-shifted input signals $I_1$ and $I_2$ are applied to one input of a respective multiplexer 32 and to an input of the combiner 30. Combiner 30 combines the first and second input signals $I_1$ and $I_2$ to generate a composite signal $I_C$. In TX Channel 1, the output of the combiner 30 is applied to a second input of the multiplexer 32. The multiplexer 32 selects either the first input signal $I_1$ or the composite signal $I_C$ from the combiner to pass to the predistorter 24. In TX Channel 2, a signal is applied to the second input of the multiplexer 32 that effectively turns off TX Channel 2. The multiplexer 32 passes the second input signal $I_2$ to the predistorter 24 in the high bandwidth mode. TX Channel 2 is effectively turned off in the low bandwidth mode.

In a high bandwidth mode, when the bandwidth $BW_C$ of the multi-band signal is greater than the bandwidth threshold $BW_{TH}$, the multiplexer 32 in TX Channel 1 outputs the first input signal $I_1$ to the corresponding predistorter 24 and the multiplexer 32 in TX Channel 2 outputs the second input signal $I_2$ to the corresponding predistorter 24. In this mode, the predistorters 24 function as component predistorters to predistort respective ones of the input signals. Since there is inherent frequency translation in the upconversion process, frequency tuning can be performed after predistortion in the high bandwidth mode by setting the frequency tuning in the frequency tuners 22 to zero and configuring the upconverters 26 to provide the desired frequency spacing.

The selection circuit 50 configures the transmit circuit 20 and adaptation circuit 60 for the desired operating mode. The operating modes include a high bandwidth operating mode and a low bandwidth operating mode. In some embodiments, the selection circuit 50 receives control input indicating the selected operating mode. Responsive to the control input, the selection circuit 50 configures the transmit circuit 20 and adaptation circuit 60 for the selected operating mode. In other embodiments, the selection circuit 50 dynamically determines the operating mode from the input signals as previously described, and configures the transmit circuit 20 and adaptation circuit 60 accordingly.

In a low bandwidth mode, when the bandwidth $BW_C$ of the multi-band signal is less than the bandwidth threshold $BW_{TH}$, the multiplexer 32 in TX Channel 1 outputs the composite signal $I_C$ to the corresponding predistorter 24. In this mode, the predistorter 24 in TX Channel 1 functions as a multi-band predistorter to predistort the composite signal $I_C$. TX Channel 2 is effectively turned off. The upconverter 26 in TX Channel 1 upconverts the predistorted multi-band signal to the desired carrier frequency before being applied to the input of the power amplifier 40.

The purpose of the predistortion is to compensate for the non-linearity of the power amplifier 40. Therefore, the combination of the predistorters 24 and the power amplifier 40 should approximate a linear system. The adaptation circuit 60 continuously adapts the coefficients of the predistorters 24 to reduce as much as possible the non-linearity in the output signal from the power amplifier 40. The adaption circuit 60 comprises a gain adjustment circuit 61, a downconverter 62, a delay and phase adjustment circuit 63, an error estimation circuit 64, and a coefficient calculation circuit 68. The gain adjustment circuit 62 adjusts the gain of the feedback signal from the power amplifier 40 to attenuate the feedback signal. Following gain adjustment, the feedback signal is downconverted by downconverter 62 to match the frequency of the feedback signal with the input signals $I_1$ and $I_2$. The feedback signal is then input to the error estimation circuit 64 and the coefficient calculation circuit 68. The delay and phase adjustment circuit 63 adjusts the phase and delay of the input signals $I_1$ and $I_2$, and composite signal $I_C$, for comparison with the feedback signals.

The error estimation circuit 64 comprises three summation circuits 66 to generate three error signals, denoted $E_1$, $E_2$, and $E_C$. The number of summation circuits 66 is a function of the number of input signals. The summation circuits 66 compare the gain adjusted feedback signal to the first input signal $I_1$, second input signal $I_2$, and composite signal $I_C$ and output the difference as an error signal. The input signals $I_1$ and $I_2$, composite signal $I_C$, and error signals $E_1$, $E_2$, and $E_C$ are input to the coefficient calculation circuit 68 along with the feedback signal. The coefficient calculation circuit 68 computes the coefficients for the predistorters 24 using standard techniques. When the high bandwidth mode is selected, the coefficient calculation circuit 68 computes coefficients for predistorting the input signals $I_1$ and $I_2$. In this mode, the error signals $E_1$ and $E_2$ are used for training. The training for the two predistorters 24 can be performed sequentially or in parallel. When the low bandwidth mode is selected, the coefficient calculation circuit 68 computes coefficients for predistorting the composite signal $I_C$. In this mode, the error signal $E_C$ is used for training.

In general, the adaptation algorithm used by the coefficient calculation circuit 68 attempts to minimize some error metric.

For example, the coefficient calculation circuit 68 may use a mean square error approach, which is well-known to those skilled in the art and therefore not described herein in detail. The mean square error technique is a popular technique because error surface is quadratic and theoretically has a unique minimum. Other known techniques suitable for adapting the predistorter coefficients include the Least Means Square (LMS) technique, and Recursive Least Squares (RLS) technique. Variations of these techniques are known in the art.

Figure 5:
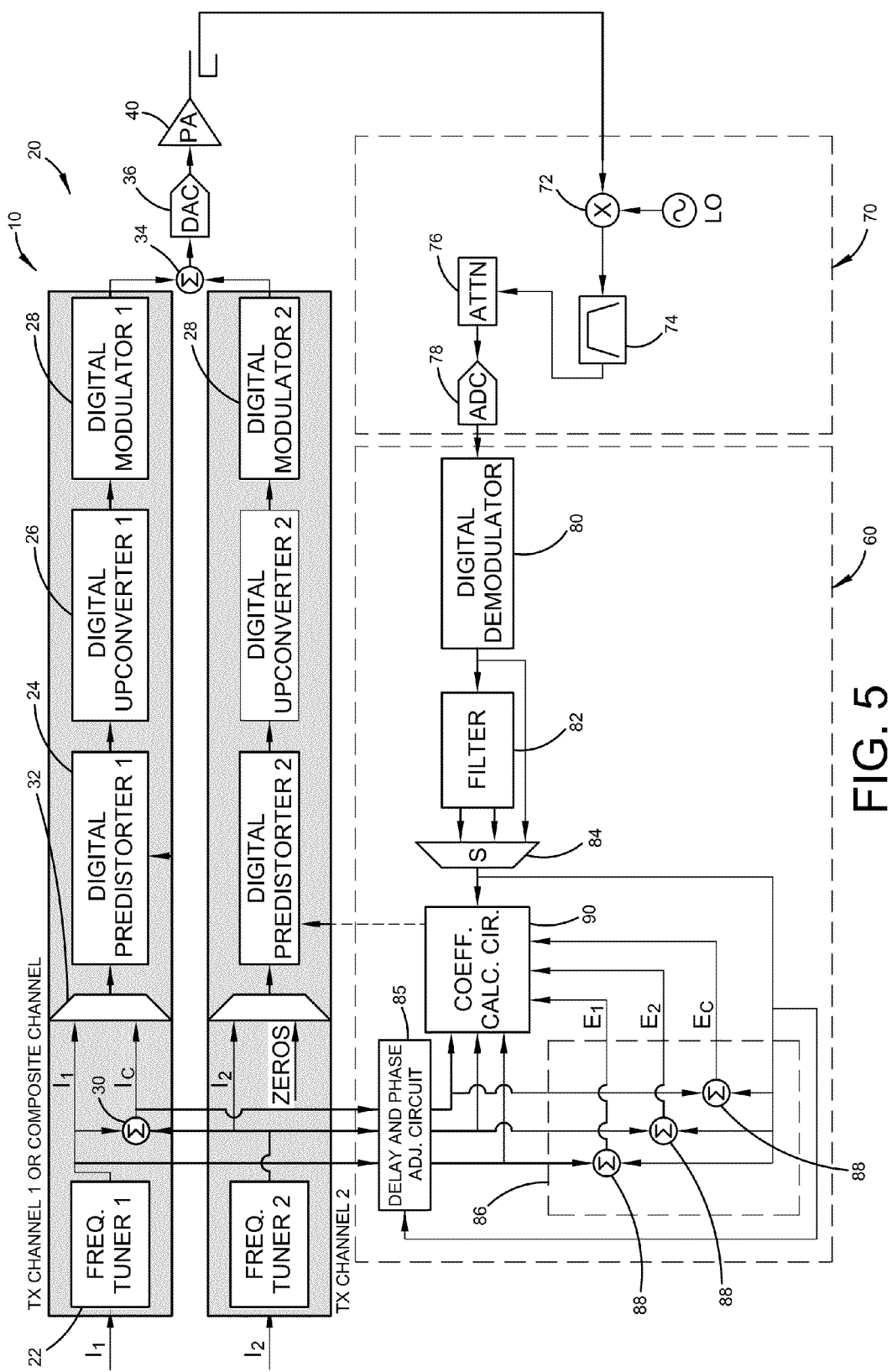
FIG. 5 illustrates a second embodiment of a multi-band transmitter where predistortion is performed in the digital domain.

FIG. 5 illustrates an exemplary embodiment of a dual-band transmitter 10 where frequency tuning, predistortion, and upconversion are performed in the digital domain. For convenience, similar reference numbers are used in FIGS. 4 and 5 to indicate components with similar function. In this embodiment, the transmit circuit 20 comprises two channels. Each transmit channel includes a frequency tuner 22, predistorter 24, and upconverter 26 that operates in the digital domain. One of the transmit channels also includes a combiner 30. First and second digital input signals $I_1$ and $I_2$ are input to respective transmit channels. The frequency tuners 22 shift the frequencies of respective ones of the input signals $I_1$ and $I_2$ to create a desired frequency offset or separation. The frequency-shifted input signals $I_1$ and $I_2$ are applied to one input of a respective multiplexer 32 and to an input of the combiner 30. Combiner 30 combines the first and second input signals $I_1$ and $I_2$ to generate a composite signal $I_C$. In TX Channel 1, the output of the combiner 30 is applied to the second input of the multiplexer 32. The multiplexer 32 selects either the first input signal $I_1$ or the composite signal $I_C$ from the combiner to pass to the predistorter 24. In TX Channel 2, a signal is applied to the second input of the multiplexer 32 that effectively turns off TX Channel 2. The multiplexer 32 passes the second input signal $I_2$ to the predistorter 24 in the high bandwidth mode. TX Channel 2 is effectively turned off in the low bandwidth mode.

The selection circuit 50 configures the transmit circuit 20 and adaptation circuit 60 for the desired operating mode. In some embodiments, the selection circuit 50 receives control input indicating the selected operating mode. Responsive to the control input, the selection circuit 50 configures the transmit circuit 20 and adaptation circuit 60 for the selected operating mode. In other embodiments, the selection circuit 50 dynamically determines the operating mode from the input signals as previously described, and configures the transmit circuit 20 and adaptation circuit 60 accordingly.

In a high bandwidth mode, when the bandwidth $BW_C$ of the multi-band signal is greater than the bandwidth threshold $BW_{TH}$, the multiplexer 32 in TX Channel 1 outputs the first input signal $I_1$ to the corresponding predistorter 24 and the multiplexer 32 in TX Channel 2 outputs the second input signal $I_2$ to the corresponding predistorter 24. In this mode, the predistorters 24 function as component predistorters to predistort respective ones of the input signals. Since there is inherent frequency translation in the upconversion process, frequency tuning can be performed after predistortion in the high bandwidth mode by setting the frequency tuning in the frequency tuners 22 to zero and configuring the upconverters 26 to provide the desired frequency spacing.

In a low bandwidth mode, when the bandwidth $BW_C$ of the multi-band signal is less than the bandwidth threshold $BW_{TH}$, the multiplexer 32 in TX Channel 1 outputs the composite signal $I_C$ to the corresponding predistorter 24. In this mode, the predistorter 24 in TX Channel 1 functions as multi-band predistorter to predistort the composite signal $I_C$. TX Channel 2 is effectively turned off. The upconverter 26 upconverts the predistorted multi-band signal to the desired carrier frequency before being applied to the power amplifier 40.

Up to this point, the basic operation of the digital embodiment is the same as the analog embodiment. In the digital embodiment, a digital modulator 28 follows the upconverter 26 in each transmit channel. The multi-band signal is converted to an analog signal by a digital-to-analog converter (DAC) 36 and applied to the input of the power amplifier 40.

The adaption circuit 60 also operates in the digital domain. A receiver circuit 70 receives the output signal from the power amplifier 40 and generates a digital baseband signal for input to the adaptation circuit 60. The receiver circuit 70 includes a mixer 72, band-pass filter 74, attenuator 76, and analog-to-digital converter (ADC) 78. The output signal from the power amplifier 40 is fed back to the receiver circuit 70. The mixer 72 downconverts the feedback signal to an intermediate frequency and the band pass filter 74 removes out-of-band components. Alternatively, a direct-downconverson receiver may be used that downconverts the feedback signal directly to baseband. Attenuator 76 attenuates the signal to reduce the signal level. Thus, the attenuator 76 performs a function analogous to the gain adjustment circuit 62 in the analog embodiment of FIG. 4. After signal level adjustment, the feedback signal is converted to a digital signal by the ADC 78 and input to the adaptation circuit 60.

The adaptation circuit 60 includes a digital demodulator 80, filter circuit 82, selection circuit 84, a delay and phase adjustment circuit 85, error estimation circuit 86, and coefficient calculation circuit 90. The digital demodulator 80 demodulates the feedback signal to generate a demodulated signal. In the exemplary embodiment shown, the demodulated signal is a composite feedback signal corresponding to the composite signal $I_C$. The filter circuit 82 filters the composite feedback signal to generate component feedback signals corresponding to the input signals $I_1$ and $I_2$. The composite feedback signal and component feedback signals are input to the selection circuit 84. Depending on the operating mode, the selection circuit 84 outputs either the component feedback signals or the composite feedback signal. When the high bandwidth mode is selected, the selection circuit 84 outputs the component feedback signals. When the low bandwidth mode is selected, the selection circuit 84 outputs the composite feedback signals. The delay and phase adjustment circuit 85 adjusts the phase and delay of the input signals $I_1$ and $I_2$, and composite signal $I_C$, for comparison with the feedback signals.

The error estimation circuit 86 comprises three summation circuits 88 to generate three error signals, denoted $E_1$, $E_2$, and $E_C$. The number of summation circuits 66 is a function of the number of input signals. The generation of the error signals is the same as previously described. The coefficient calculation circuit 90 computes the coefficients for the predistorters 24 based on the error signals using standard techniques. When the high bandwidth mode is selected, the coefficient calculation circuit 90 computes coefficients for predistorting the input signals $I_1$ and $I_2$. In this mode, the error signals $E_1$ and $E_2$ are used for independently training the respective predistorters. As previously noted, the training for the two predistorters can be performed sequentially or in parallel. When the low bandwidth mode is selected, the coefficient calculation circuit 90 computes coefficients for predistorting the composite signals $I_C$. In this mode, the error signal $E_C$, is used for training.

In one exemplary embodiment, the adaptation circuit 60 adapts the coefficients for the predistorters 24 sequentially in the high bandwidth mode and the selection circuit 84 outputs the component feedback signals in sequence. This approach reduces the computational resources required for adaption at the cost of some delay. In other embodiments, the selection circuit 84 is configured to output the component feedback signals in parallel and the adaption circuit 60 is configured to adapt the coefficient for both predistorters 24 at the same time. In this case, the selection circuit 84 outputs the component feedback signals in parallel.

Figure 6:
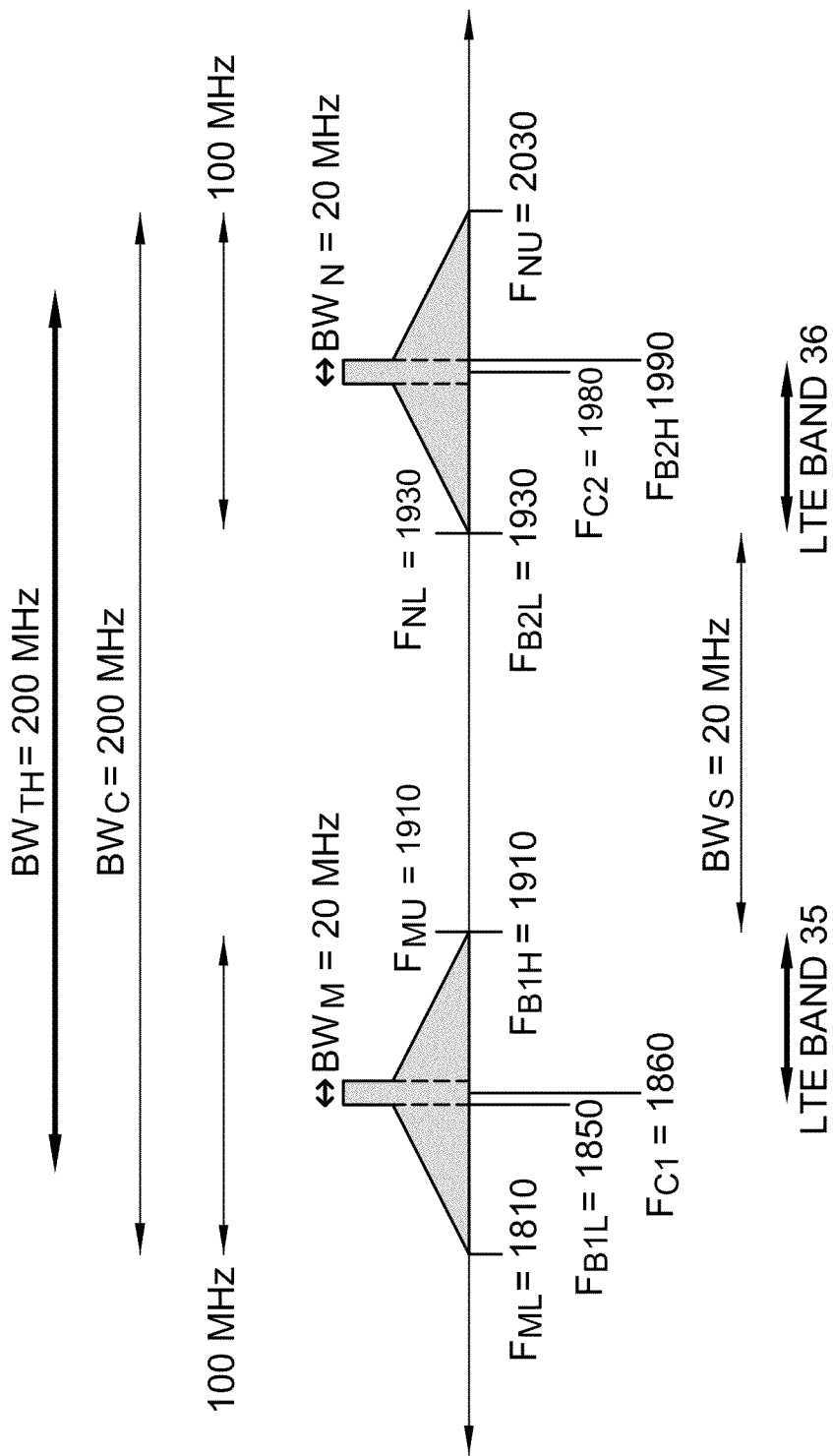
FIG. 6 illustrates a multiband LTE signal with a bandwidth greater than the bandwidth threshold.
Figure 7:
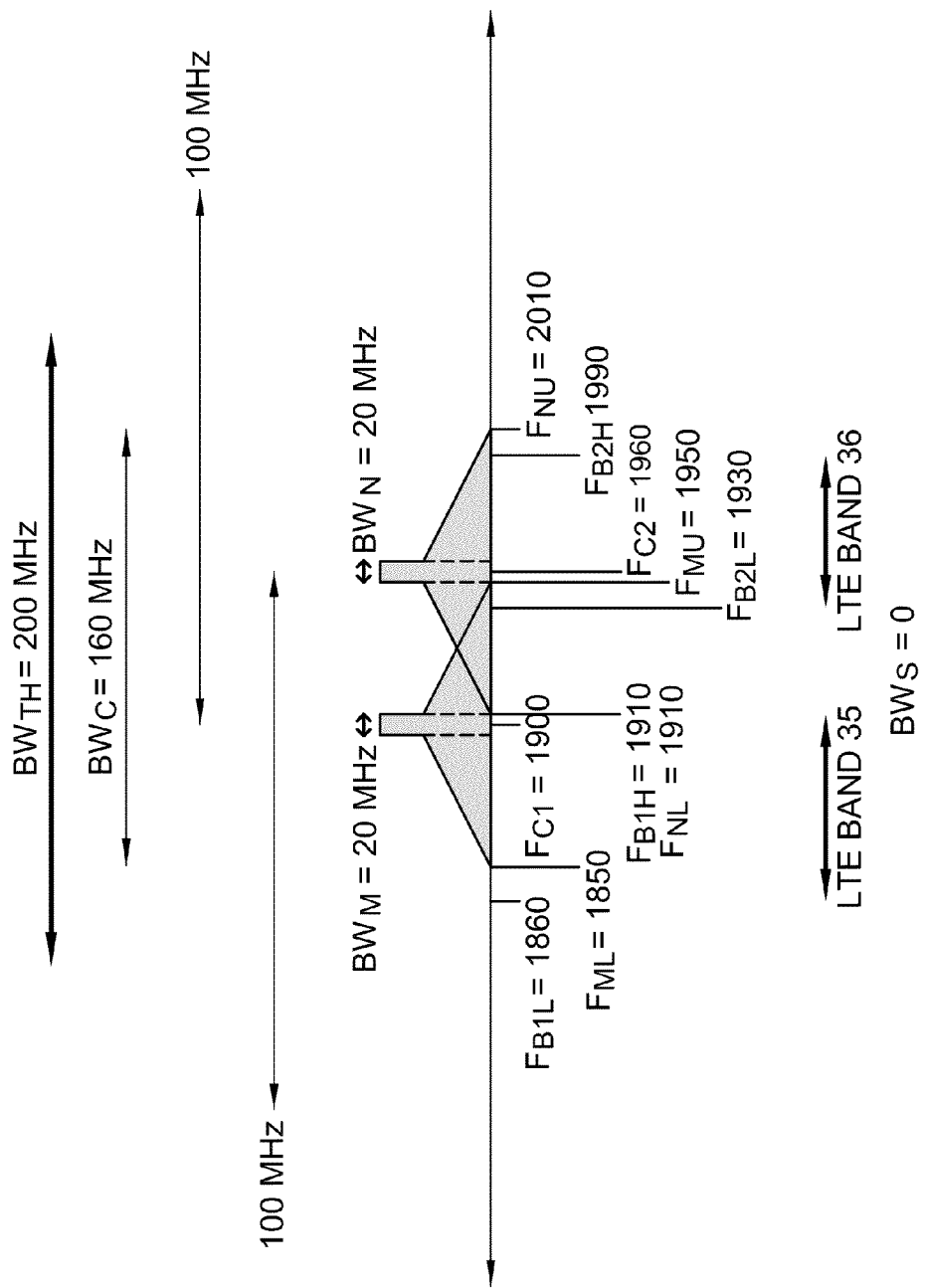
FIG. 7 illustrates a multiband LTE signal with a bandwidth less than the bandwidth threshold.

FIGS. 6 and 7 illustrate signal images in a multi-band signal for an embodiment of the invention adapted for use in a Long Term Evolution (LTE) system using time division duplexing (TDD). The signal images in FIGS. 6 and 7 are tuned to bands 35 and 36 respectively. The bandwidth threshold $BW_{TH}$ is 200 MHz. In FIG. 6, the input signals are tuned to 1860 MHz and 1980 MHz respectively. The bandwidth $BW_C$ of the composite signal taking bandwidth expansion into account is 220 MHz, which is greater than the threshold bandwidth (200 MHz). In this example, both the TX Channels would be employed to transmit the input signals. In terms of linearization, the predistorter 24 in each transmit channel is trained separately using its respective input signal. In FIG. 7, input signals are tuned to 1900 MHz and 1960 MHz respectively. The bandwidth $BW_C$ of the composite signal is 160 MHz, which is less than the threshold bandwidth $BW_{TH}$. Therefore, in this example a single TX Channel is used for transmission. It should be noted that the input signal energies overlap after predistortion in the example shown in FIG. 7. In this case, it would be very difficult to attain good linearization performance by separating out the two signals and predistorting them individually. The present invention avoids the problem by treating the two input signals as one composite signal and using a single predistorter 24 to linearize the power amplifier 40.

Figure 8:
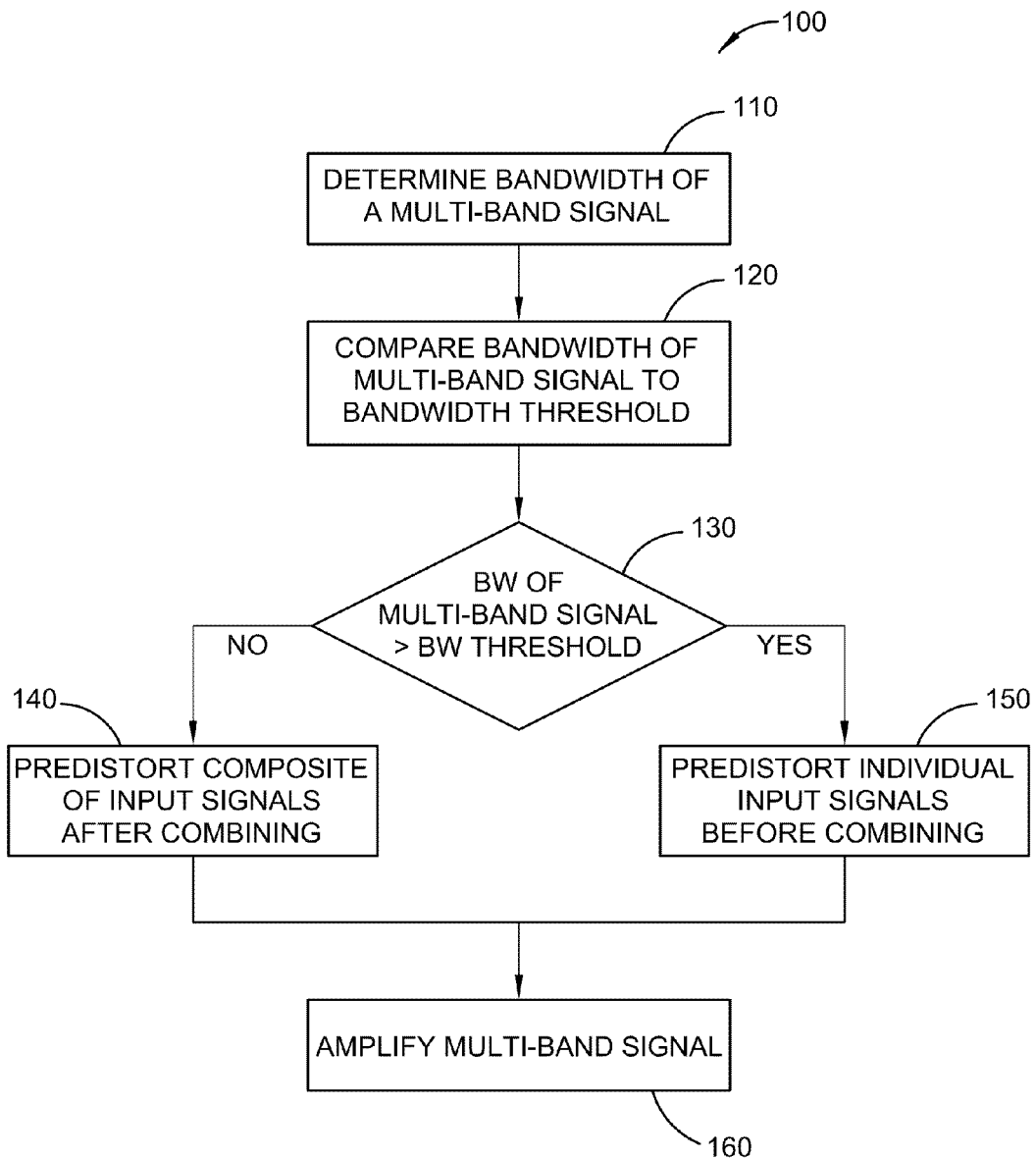
FIG. 8 illustrates an exemplary method for linearizing a multi-band signal input to a single power amplifier.

FIG. 8 illustrates an exemplary method 100 performed by the multi-band transmitter 10. The method begins when two or more input signals are input to the transmitter 10. The transmitter 10 determines an approximate bandwidth of a multi-band signal comprising all of the input signals (block 110). The determination of the bandwidth takes into account bandwidth expansion due to predistortion and the separation bandwidth between input signals. The bandwidth may be computed according to Eq. (4). The transmitter 10 then compares the bandwidth of the multi-band signal with the bandwidth threshold (block 120) and selects an operating mode (block 130). If the bandwidth of the multi-band signal is less than the bandwidth threshold, the low bandwidth mode is selected. In this mode, a single channel is used to transmit the multi-band signal and the predistorter 24 in TX Channel 1 is configured to predistort a composite of the input signals to generate the multi-band signal (block 140). If the bandwidth of the multi-band signal is greater than the bandwidth threshold, separate transmit channels are used to transmit the individual input signals. In this case, the predistorter in each transmit channel is configured to predistort a corresponding one of the input signals before combining to generate the multi-band signal (block 150). In either mode, a single power amplifier 40 is used to amplify the multi-band signal (block 160).

The transmitter 10 shown in FIGS. 4 and 5 have two modes of operation, the high bandwidth mode and the low bandwidth mode. In the high bandwidth mode, all of the input signals are combined prior to predistortion. In the low bandwidth mode, all of the input signals are predistorted before being combined. When the multi-band signal includes three or more input signals, other modes are possible. For example, in the case where there are three input signals, the transmitter 10 could be configured to combine two signals before predistortion and predistort the third signal individually, i.e. a mixed bandwidth mode. The possible permutations increase as the number of input signals increases.

Figure 9:
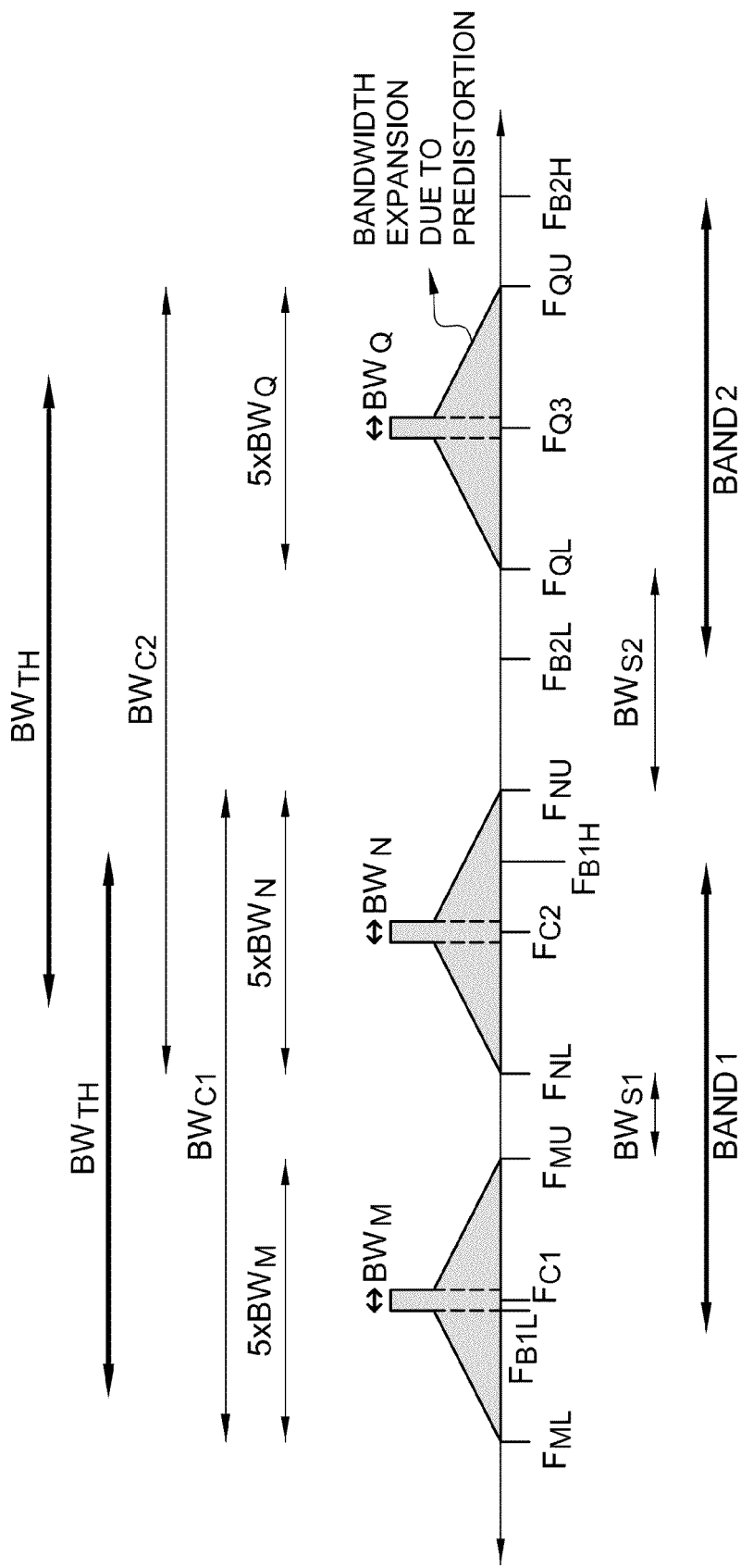
FIG. 9 illustrates a multiband signal with three signal images separated in the frequency domain.
Figure 10:
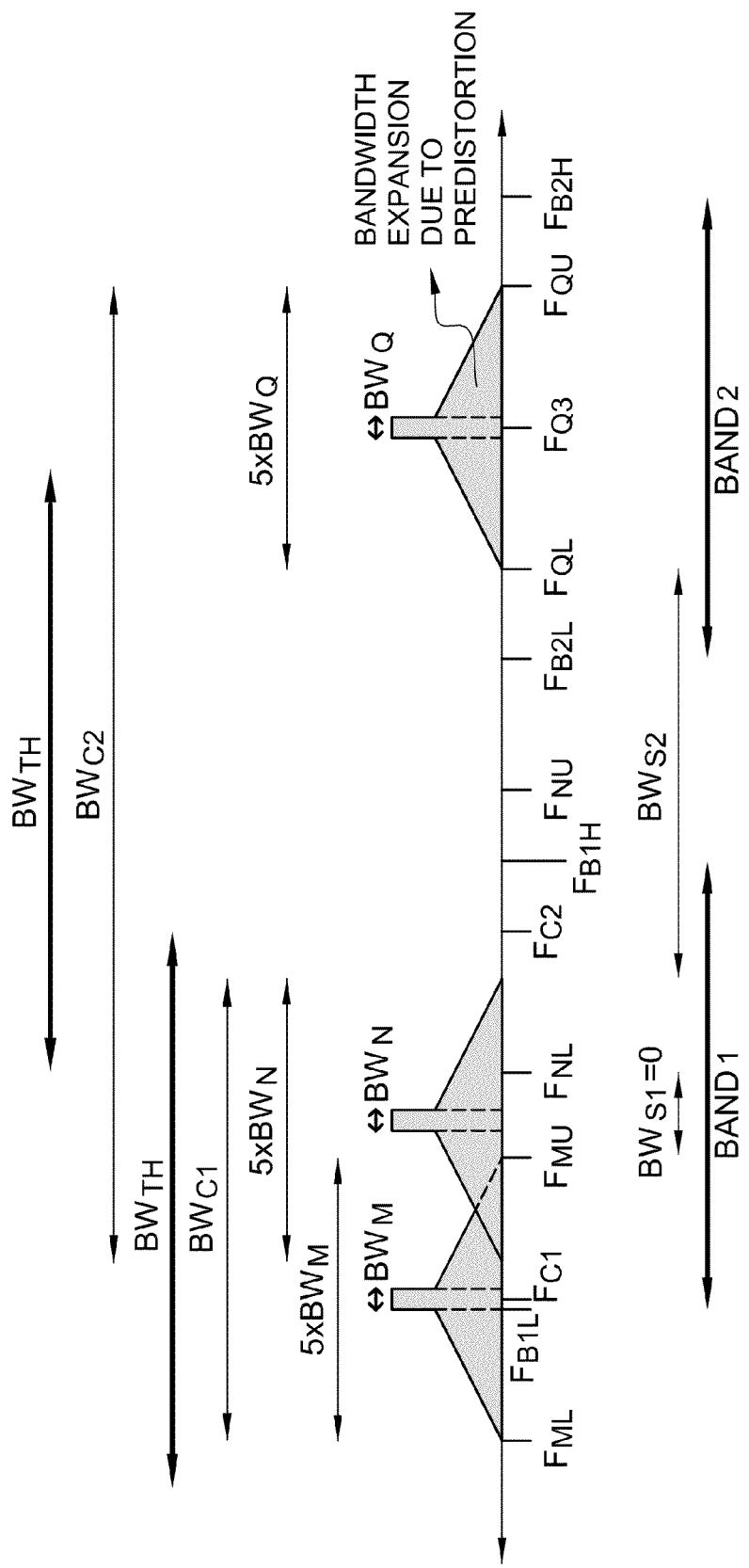
FIG. 10 illustrates a multiband signal with two overlapping signal images and a third signal image separated in the frequency domain.
Figure 11:
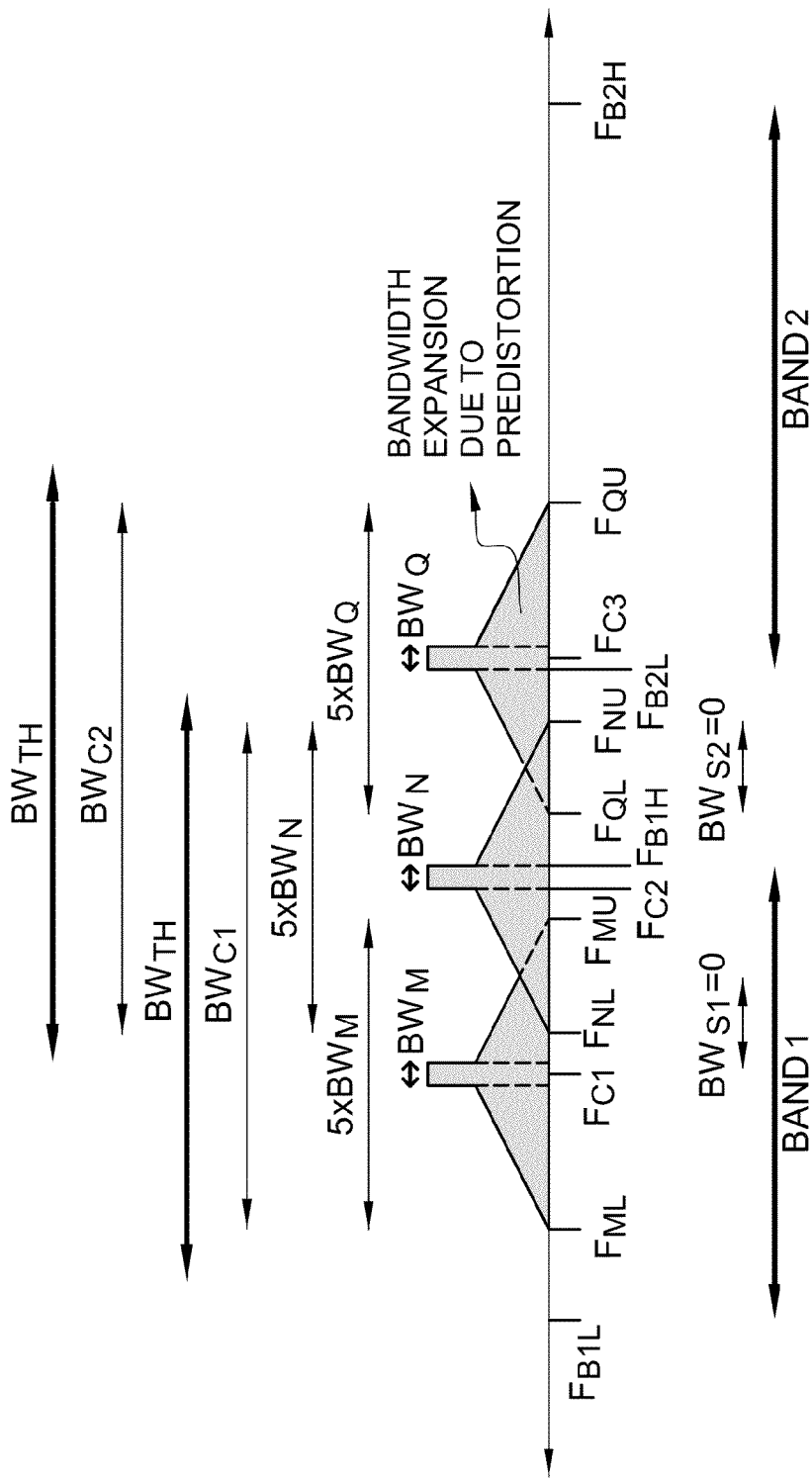
FIG. 11 illustrates a multiband signal with three overlapping signal images

FIGS. 9-11 illustrate possible permutations of the case where three input signals are being transmitted. FIGS. 9-11 show input signal M with bandwidth $BW_M$ centered on RF frequency $F_{C1}$ in band 1, input signal N of bandwidth $BW_N$ centered on RF frequency $F_{C2}$ in band 1, and input signal Q of bandwidth $BW_Q$ centered on RF frequency $F_{C3}$ in band 2. Note that input signal N may be in a band of its own but this would not effect the discussion below. Band 1 ranges from frequency $F_{B1L}$ to $F_{B1H}$ and band 2 range from $F_{B2L}$ to $F_{B2H}$. Thus, $$F_{B1L} < F_{C1} < F_{B1H} \qquad \text{Eq. (7)}$$

$$F_{B1L} < F_{C2} < F_{B1H} \qquad \text{Eq. (8)}$$

and $$F_{B2L} < F_{C3} < F_{B2H} \qquad \text{Eq. (9)}$$

FIGS. 9, 10, and 11 illustrate the edges of the input signals after taking bandwidth expansion due to predistortion into account. The edges of signal M are denoted as $F_{ML}$ and $F_{MU}$ for the lower and upper edges respectively. The edges of signal N are denoted as $F_{NL}$ and $F_{NU}$ for the lower and upper edges respectively. The edges of signal Q are denoted as $F_{QL}$ and $F_{QU}$ for the lower and upper edges respectively. The bandwidth of the multi-band signal can then be computed according to:

$$BW_C = F_{QC} - F_{ML} \qquad \text{Eq. (10)}$$

The bandwidths of the composite signal comprising input signals M and N, and the composite signal comprising input signals N and Q, may be calculated as $$BW_C = F_{NU} - F_{ML} \qquad \text{Eq. (11)}$$

$$BW_{C2} = F_{QU} - F_{NL} \qquad \text{Eq. (12)}$$

The separation bandwidth $BW_{S1}$ between signal M and signal N is:

$$BW_{S1} = F_{NL} - F_{ML}, \text{ for } F_{NL} > F_{MU}$$

$$BW_{S1} = 0, \text{ for } F_{NL} \leq F_{MU} \qquad \text{Eq. (13)}$$

The separation bandwidth $BW_{S2}$ between signal N and signal Q is:

$$BW_{S2} = F_{QL} - F_{NU}, \text{ for } F_{QL} > F_{NU}$$

$$BW_{S2} = 0, \text{ for } F_{QL} \leq F_{NU} \qquad \text{Eq. (14)}$$

For this example, it is assumed that the frequencies in band 1 are lower than those of band 2.

In this embodiment, rather than evaluate the bandwidth of the entire multi-band signal, the bandwidth of the composite signals is evaluated and used to determine whether the input signals should be combined or not. If $BW_{C1}$ and $BW_{C2}$ are both greater than the bandwidth threshold $BW_{TH}$ as shown in FIG. 9, signals M, N are Q each tuned and predistorted separately and then combined to form the multi-band signal, which is subsequently modulated and then amplified by the power amplifier 40. Alternatively, the separation bandwidths could be compared to the bandwidth threshold $BW_{TH}$. If $BW_{C1}$ is less than the bandwidth threshold $BW_{TH}$ and $BW_{C2}$ is greater than the bandwidth threshold $BW_{TH}$ as shown in FIG. 10, the signals M and N are tuned separately and then combined to create a composite signal. The composite of input signals M and N is then predistorted. Input signal Q is predistorted separately. The predistorted composite of input signals M and N is then combined with input signal Q after predistortion to form the multi-band signal. If $BW_{C1}$ and $BW_{C2}$ are both less than the bandwidth threshold $BW_{TH}$ as shown in FIG. 11, input signals M, N, and Q are all combined before predistortion using a single predistorter to create the multi-band signal. The multi-band signal is subsequently upconverted, modulated, and then amplified by the power amplifier 40.

Figure 12:
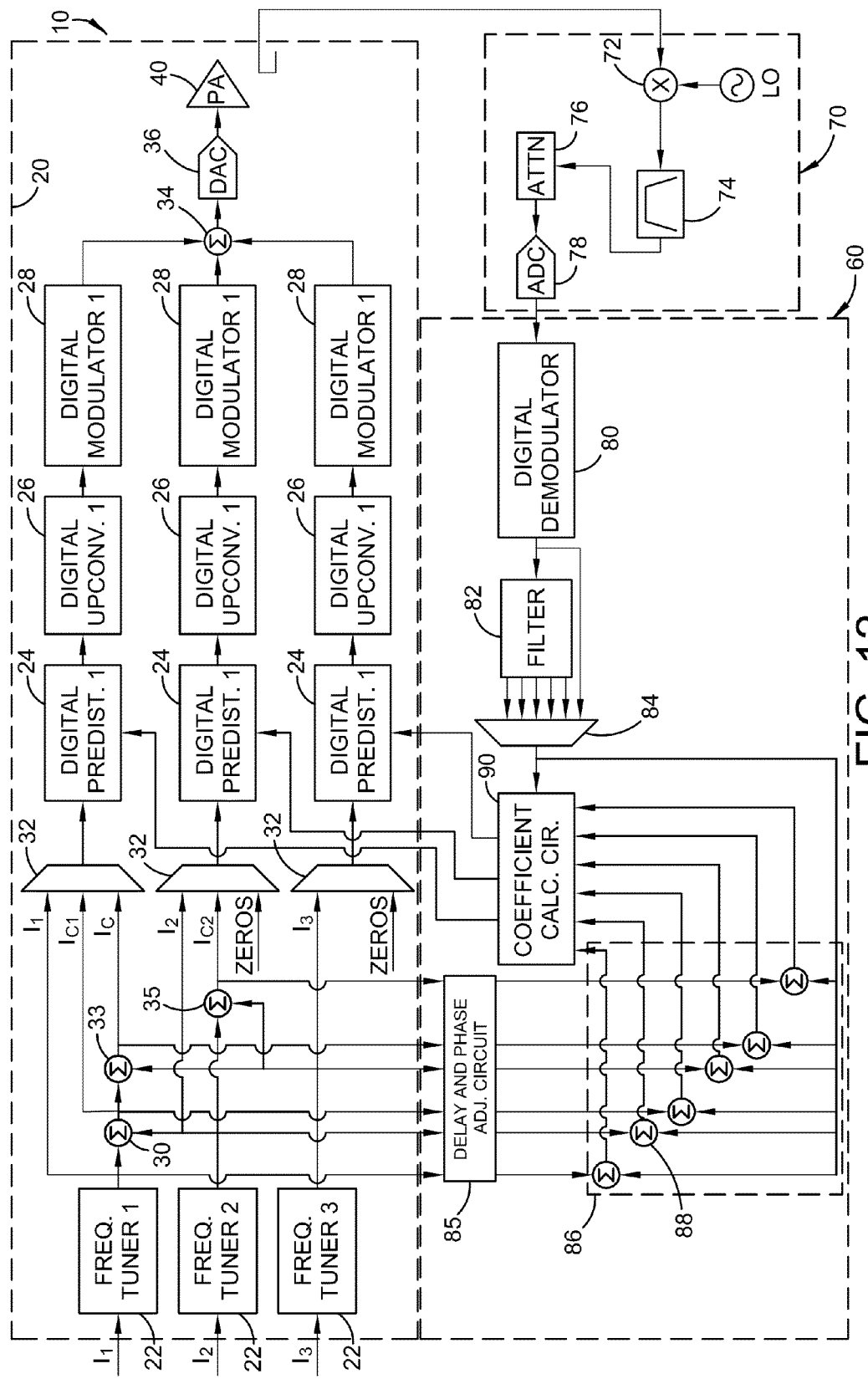
FIG. 12 illustrates a third embodiment of the multi-band transmitter.

FIG. 12 illustrates an embodiment of the transmitter 10 capable of three different modes of operation: a high bandwidth mode, a low bandwidth mode and a mixed bandwidth mode. For convenience, similar reference numbers are used in FIGS. 5 and 9 to indicate similar elements. As previously described, the multi-band transmitter 10 includes a transmit circuit 20, power amplifier 40, selection circuit 50 (not shown in FIG. 4), and an adaptation circuit 60. The transmit circuit 20 includes multiple transmit channels. Each transmit channel includes a frequency tuner 22, predistorter 24, and upconverter 26 that operates in the digital domain. Transmit channel 1 includes combiners 30 and 33. Digital input signals $I_1$, $I_2$, and $I_3$ are input to respective transmit channels. The frequency tuners 22 shift the frequencies of respective ones of the input signals $I_1$, $I_2$, and $I_3$ to create a desired frequency offset or separation. The frequency-shifted input signal $I_1$, is applied to one input of the corresponding multiplexer 32 and to the first input of combiner 30. The frequency-shifted input signal $I_2$, is applied to one input of the corresponding multiplexer 32 and to the second input of combiner 30. Combiner 30 combines the first and second input signals $I_1$ and $I_2$ to generate a composite signal $I_C$. The composite signal is applied to the first input of combiner 33. The input signal $I_2$ is also applied to the first input of combiner 35. The frequency-shifted input signal $I_3$, is applied to one input of the corresponding multiplexer 32 and to the second input of combiner 35. Combiner 35 combines the second and third input signals $I_2$ and $I_3$ to generate a composite signal $I_{C2}$. The frequency-shifted input signal $I_3$ is also applied to the second input of combiner 33, which combines input signal $I_3$ with the composite signal $I_{C1}$ to generate a composite signal $I_C$. The composite signal $I_C$ is a composite of all of the input signals.

The adaption circuit 60 is essentially the same as previously described. A receiver circuit 70 receives the output signal from the power amplifier 40 and generates a digital baseband signal for input to the adaptation circuit 60. The receiver circuit 70 includes a mixer 72, band-pass filter 74, attenuator 76, and analog-to-digital converter (ADC) 78. The output signal from the power amplifier 40 is fed back to the receiver circuit 70. The mixer 72 downconverts the feedback signal to an intermediate frequency and the band pass filter 74 removes out-of-band components. Alternatively, a direct-downconverson receiver may be used that downconverts the feedback signal directly to baseband. Attenuator 76 attenuates the signal to reduce the signal level. Thus, the attenuator 76 performs a function analogous to the gain adjustment circuit 62 in the analog embodiment of FIG. 4. After signal level adjustment, the feedback signal is converted to a digital signal by the ADC 78 and input to the adaptation circuit 60.

The adaptation circuit 60 includes a digital demodulator 80, filter circuit 82, selection circuit 84, a delay and phase adjustment circuit 85, error estimation circuit 86, and coefficient calculation circuit 90. The digital demodulator 80 demodulates the feedback signal to generate a demodulated signal. In the exemplary embodiment shown, the demodulated signal is a composite feedback signal corresponding to the composite signal $I_C$. The filter circuit 82 filters the composite feedback signal to generate component feedback signals corresponding to the input signals $I_1$, $I_2$, and $I_3$, and to the composite signals $I_{C1}$ and $I_{C2}$. The composite feedback signal and component feedback signals are input to the selection circuit 84. Depending on the operating mode, the selection circuit 84 outputs corresponding component feedback signals to the error calculation circuit 86 and the coefficient calculation circuit 90.

The delay and phase adjustment circuit 85 adjusts the phase and delay of the input signals $I_1$, $I_2$, and $I_3$, and composite signals $I_{C1}$, $I_{C2}$, and $I_C$, for comparison with the feedback signals. The adjusted signals are applied to the error calculation circuit 86.

The error estimation circuit 86 comprises six summation circuits 88 to generate the error signals, denoted $E_1$, $E_2$, $E_3$, $E_{C1}$, $E_{C2}$, and $E_C$. The number of summation circuits 88 is a function of the number of input signals and composite signals. The generation of the error signals is the same as previously described. The coefficient calculation circuit 90 computes the coefficients for the predistorters 24 based on the error signals using standard techniques.

In one exemplary embodiment, the adaptation circuit 60 adapts the coefficients for the predistorters 24 sequentially. This approach reduces the computational resources required for adaption at the cost of some delay. In other embodiments, the adaption circuit 60 is configured to adapt the coefficients for all predistorters 24 at the same time. In some embodiments, the selection circuit 50 receives control input indicating the selected operating mode. Responsive to the control input, the selection circuit 50 configures the transmit circuit 20 and adaptation circuit 60 for the selected operating mode. In other embodiments, the selection circuit 50 dynamically determines the operating mode from the input signals as previously described, and configures the transmit circuit 20 and adaptation circuit 60 accordingly.

The embodiment shown in FIG. 12 includes additional operating modes not available in the embodiments shown in FIGS. 4 and 5. More particularly, the transmitter 10 of FIG. 12 enables two of the input signals to be combined prior to predistortion, and the third input signal to be predistorted individually.

Figure 13:
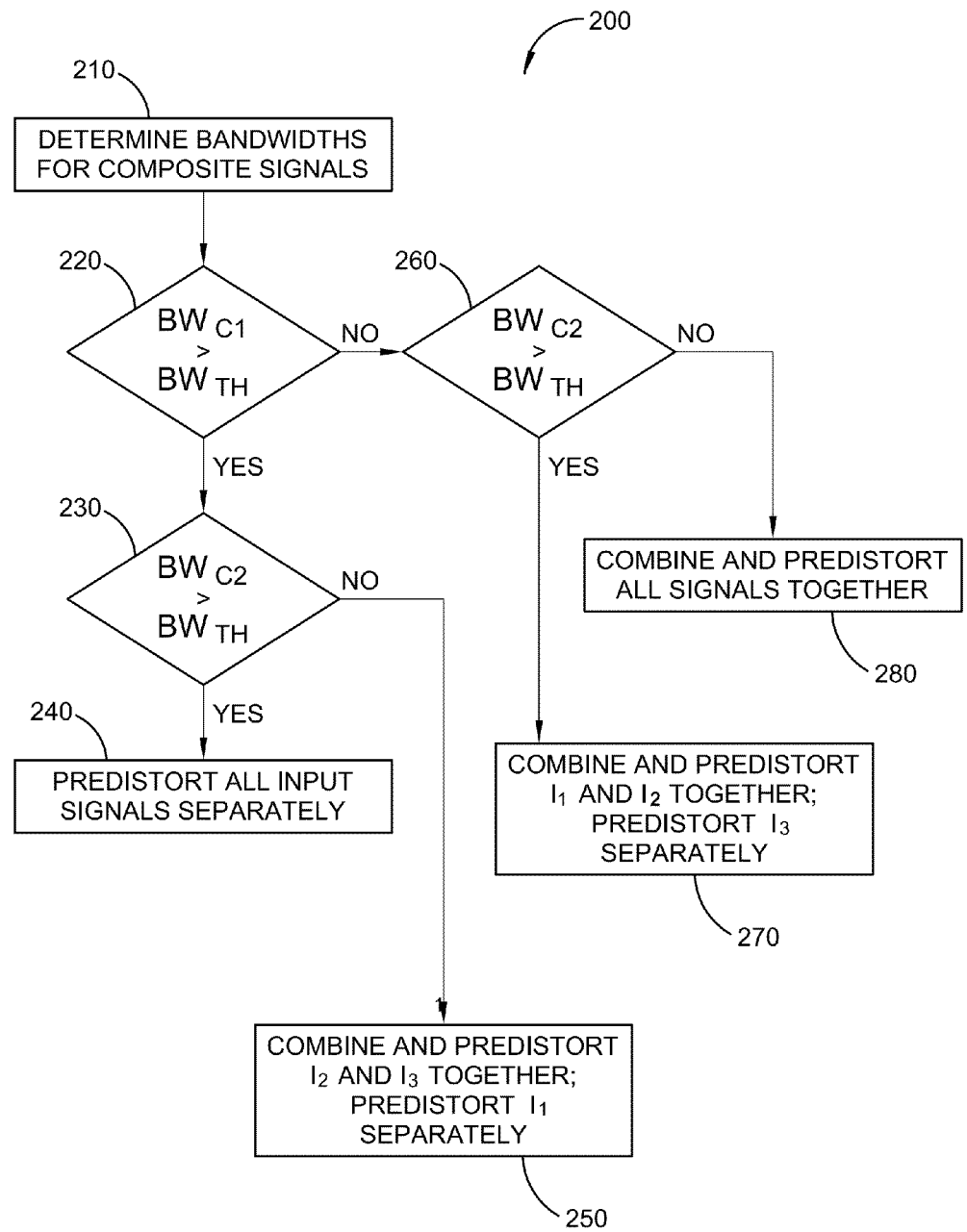
FIG. 13 illustrates an exemplary method for linearizing a multi-band signal input to a single power amplifier.

FIG. 13 illustrates a method 200 for selecting the operating mode of the transmitter shown in FIG. 12. To begin, the bandwidth $BW_{C1}$ for the composite signal $I_{C1}$, the bandwidth $BW_{C2}$ for the composite signal $I_{C2}$, and the total bandwidth $BW_C$ for the composite signal $I_C$ are determined (block 210). Next, the bandwidth $BW_{C1}$ is compared to the bandwidth threshold $BW_{TH}$ (block 220). If $BW_{C1}$ is greater than $BW_{TH}$, the bandwidth of $BW_{C2}$ is compared to the bandwidth threshold $BW_{TH}$ (block 230). If $BW_{C2}$ is greater than $BW_{TH}$, the high bandwidth mode is selected and all of the input signals are tuned and predistorted separately (block 240). If $BW_{C2}$ is less than $BW_{TH}$, input signal, a mixed bandwidth mode is selected wherein input signals $I_2$ and $I_3$ are combined prior to predistortion, while $I_1$ is predistorted separately (block 250).

Returning to block 220, if $BW_{C1}$ is less than the bandwidth threshold $BW_{TH}$, the bandwidth $BW_{C2}$ is compared to the bandwidth threshold $BW_{TH}$ (block 260). If $BW_{C2}$ is greater than the bandwidth threshold $BW_{TH}$, a mixed bandwidth mode is selected wherein input signals $I_1$ and $I_2$ are combined prior to predistortion, while $I_3$ is predistorted separately (block 270). If $BW_{C2}$ is less than the bandwidth threshold $BW_{TH}$, a low bandwidth mode is selected. In this mode, the input signals $I_1$, $I_2$, and $I_3$ are combined to create a composite signal $I_C$ and the composite signal $I_C$ is predistorted using a single predistorter (block 280).

Table 1 below shows the configuration of the transmitter 10 for the different operating modes described above.

| Mode | Signals predistorted | Feedback signals selected | Error signals generated | Condition |
|---|---|---|---|---|
| 1 | $I_1, I_2, I_3$ | $F_1, F_2, F_3$ | $E_1, E_2, E_3$ | $BW_{C1} > BW_{TH}$, $BW_{C2} > BW_{TH}$ |
| 2 | $I_{C1}, I_3$ | $F_{C1}, F_3$ | $E_{C1}, E_3$ | $BW_{C1} < BW_{TH}$, $BW_{C2} > BW_{TH}$ |
| 3 | $I_1, I_{C2}$ | $F_1, F_{C2}$ | $E_1, E_{C2}$ | $BW_{C1} > BW_{TH}$, $BW_{C2} < BW_{TH}$ |
| 4 | $I_C$ | $F_C$ | $E_C$ | $BW_{C1} < BW_{TH}$, $BW_{C2} < BW_{TH}$ |

The present invention solves some of the problems associated with predistortion of a multi-band signal. The low bandwidth mode avoids the need to separate overlapping signals to calculate coefficients for each predistorter 24. Such signal separation would have a drastic effect on the linearization performance, as it is difficult to compensate for the distortion induced by the filtering process. The present invention avoids the problem by using a composite signal for training when the bandwidth is below a certain threshold bandwidth. Also, power can be conserved by turning off all but one of the transmit channels in the low bandwidth mode. In digital implementations, the high bandwidth mode avoids the need for very high sampling rates and consequent complexity by using multiple transmit channels, each with its own predistorter. In analog implementations, the high bandwidth mode avoids very wide bandwidths in the filters.

The present invention may, of course, be carried out in other specific ways than those herein set forth without departing from the scope and essential characteristics of the invention. The present embodiments are, therefore, to be considered in all respects as illustrative and not restrictive, and all changes coming within the meaning and equivalency range of the appended claims are intended to be embraced therein.

What is claimed is:

1. A method of transmitting a multi-band output signal, said method comprising:
   determining a bandwidth of a composite signal comprising two or more input signals to be transmitted on different frequency bands;
   comparing the bandwidth of the composite signal to a bandwidth threshold;
   if the bandwidth of the composite signal is greater than the bandwidth threshold, generating a multi-band signal by predistorting at least one of the individual input signals before combining with the other input signals;
   if the bandwidth of the composite signal is less than the bandwidth threshold, generating a multi-band signal by predistorting the composite signal; and
   amplifying the multi-band signal to generate the multi-band output signal for transmission over a wireless channel.

2. The method of claim 1 wherein generating a multi-band signal by predistorting at least one of the individual input signals before combining comprises:
   predistorting one or more individual input signal with separate component predistorters; and
   combining the predistorted input signals with one or more other predistorted signals to generate the multi-band signal.

3. The method of claim 2 further comprising adapting one or more component predistorters based on respective component feedback signals corresponding to the input signals.

4. The method of claim 3 wherein adapting one or more component predistorters comprises adapting the component predistorters sequentially in time.

5. The method of claim 3 wherein adapting one or more component predistorters comprises adapting the component predistorters in parallel at the same time.

6. The method of claim 1 wherein generating a multi-band signal by predistorting the composite signal comprises:
   combining the input signals to generate the composite signal; and
   predistorting the composite signal with a multi-band predistorter.

7. The method of claim 6 further comprising adapting the multi-band predistorter based on a composite feedback signal corresponding to the composite signal.

8. The method of claim 6 wherein generating a multi-band signal by predistorting the composite signal further comprises combining the composite signal after predistortion with one or more other predistorted signals to generate the multi-band signal.

9. The method of claim 8 wherein the one or more other predistorted signals include at least one input signal that is predistorted separately in a component predistorter.

10. The method of claim 9 further comprising:
    adapting the multi-band predistorter based on a composite feedback signal corresponding to the composite signal; and
    adapting the component predistorter based on a component feedback signal corresponding to the input signal that is predistorted separately.

11. The method of claim 10 wherein the multi-band predistorter and component predistorter are adapted sequentially in time.

12. The method of claim 10 wherein the multi-band predistorter and component predistorter are adapted in parallel at the same time.

13. The method of claim 1 wherein determining the bandwidth of the composite signal comprises determining the bandwidth of the composite signal from the bandwidths of the input signals, separation bands between the input signals, and a bandwidth expansion of the input signals attributable to predistortion.

14. The method of claim 1 further comprising determining the bandwidth threshold.

15. The method of claim 14 wherein determining the bandwidth threshold comprises determining the bandwidth threshold from the maximum bandwidth of the individual input signals, the number of input signals, and a predetermined expansion factor.

16. The method of claim 1 further comprising:
    frequency tuning the input signals before or after predistorting the individual input signals when the bandwidth of the composite signal is greater than the bandwidth threshold, or
    frequency tuning the input signals prior to combining the individual input signals when the bandwidth of composite signal is less than the bandwidth threshold.

17. A transmitter for transmitting a multi-band signal comprising two or more input signals separated in frequency, said transmitter comprising:
    a configurable transmit circuit to generate a multi-band signal from two or more input signals to be transmitted on different frequency bands, said transmit circuit comprising:
    a plurality of predistorters;

one or more combiners to selectively combine two or input signals before predistortion depending on a bandwidth of a composite signal including the two or more input signals; and an amplifier to amplify the multi-band signal to generate the multi-band output signal; and a selection circuit to selectively configure the transmit circuit to:

generate a multi-band signal by predistorting one or more input signals individually in component predistorters when the bandwidth of the composite signal is greater than a predetermined bandwidth threshold; and generate a multi-band signal by predistorting the composite signal when the bandwidth of the composite is greater than a predetermined bandwidth threshold.

18. The transmitter of claim 17 wherein the transmit circuit is configurable by the selection circuit to:

predistort one or more individual input signals with separate component predistorters; and combine the predistorted input signals with one or more other predistorted signals to generate the multi-band signal.

19. The transmitter of claim 18 further including an adaptation circuit configured to adapt one or more component predistorters based on respective component feedback signals corresponding to the input signals.

20. The transmitter of claim 18 wherein the adaption circuit is further configured to adapt the component predistorters sequentially in time.

21. The transmitter of claim 18 wherein the adaption circuit is further configured to adapt the component predistorters in parallel at the same time.

22. The transmitter of claim 18 wherein the transmit circuit is configurable by the selection circuit to:

combine the input signals to generate the composite signal; and predistort the composite signal with a multi-band predistorter.

23. The transmitter of claim 18 further including an adaptation circuit configured to adapt the multi-band predistorter based on a composite feedback signals corresponding to the composite signal.

24. The transmitter of claim 23 wherein the transmit circuit is configurable by the selection circuit to combine the composite signal after predistortion with one or more other predistorted signals to generate the multi-band signal.

25. The transmitter of claim 24 wherein the transmit circuit is configurable by the selection circuit to combine the composite signal with at least one input signal that is predistorted separately in a component predistorter.

26. The transmitter of claim 25 further comprising an adaptation circuit configurable to:

adapt the multi-band predistorter based on a composite feedback signal corresponding to the composite signal; and adapt the component predistorter based on a component feedback signal corresponding to the input signal that is predistorted separately.

27. The transmitter of claim 25 wherein the adaptation circuit is configurable to adapt the multi-band predistorter and component predistorter sequentially in time.

28. The transmitter of claim 25 wherein the adaptation circuit is configurable to adapt the multi-band predistorter and component predistorter in parallel at the same time.

29. The transmitter of claim 17 wherein the selection circuit is further configured to determine the bandwidth of the multi-band signal from the bandwidths of the input signals, separation bands between the input signals, and a bandwidth expansion of the input signals attributable to predistortion.

30. The transmitter of claim 17 wherein the selection circuit is further configured to determine the bandwidth threshold.

31. The transmitter of claim 17 wherein the selection circuit is further configured to determine the bandwidth threshold from the maximum bandwidth of the individual input signals, the number of input signals, and a predetermined expansion factor.

32. The transmitter of claim 30 wherein the transmit circuit further includes one or more frequency tuners to tune respective input signals before combining.

* * * * *